(12) United States Patent
Lu et al.

(10) Patent No.: US 8,248,822 B2
(45) Date of Patent: Aug. 21, 2012

(54) REMOVEABLE SHIELD-CAN AND PRINTED CIRCUIT BOARD ASSEMBLY USING SAME

(75) Inventors: Xu-Dong Lu, Shenzhen (CN); Wen-Yi Yin, Shenzhen (CN); Kuan-Hung Chen, Shindian (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 83 days.

(21) Appl. No.: 12/889,624

(22) Filed: Sep. 24, 2010

(65) Prior Publication Data

US 2012/0044663 A1 Feb. 23, 2012

(30) Foreign Application Priority Data

Aug. 19, 2010 (CN) .......................... 2010 1 0257524

(51) Int. Cl.
*H05K 9/00* (2006.01)
(52) U.S. Cl. ......... 361/816; 361/818; 361/800; 174/350
(58) Field of Classification Search .................. 361/800, 361/816, 818, 799, 753; 174/350, 377, 351
See application file for complete search history.

(56) References Cited

U.S. PATENT DOCUMENTS

| | | | | |
|---|---|---|---|---|
| 5,508,889 | A * | 4/1996 | Ii | 361/816 |
| 6,060,659 | A * | 5/2000 | Borowiec et al. | 174/372 |
| 6,136,131 | A * | 10/2000 | Sosnowski | 156/256 |
| 6,268,877 | B1 * | 7/2001 | Sato et al. | 347/241 |
| 6,420,649 | B1 * | 7/2002 | Kahl et al. | 174/377 |
| 6,501,016 | B1 * | 12/2002 | Sosnowski | 174/382 |
| 6,593,523 | B2 * | 7/2003 | Okada et al. | 174/377 |
| 6,872,881 | B2 * | 3/2005 | Horng | 174/384 |
| 6,979,773 | B2 * | 12/2005 | Fursich | 174/377 |
| 7,277,301 | B2 * | 10/2007 | Liang | 361/816 |
| 7,429,192 | B2 * | 9/2008 | Liao et al. | 439/567 |

* cited by examiner

*Primary Examiner* — Dameon Levi
(74) *Attorney, Agent, or Firm* — Altis Law Group, Inc.

(57) ABSTRACT

A PCB assembly, includes a shield-can and a PCB, the shield-can forms resisting portions and hook members; The PCB has a top surface and an opposite bottom surface, and the PCB defines engaging holes through the top surface and bottom surface; The shield-can be detachably assembled on the PCB, the resisting portions resist against the top surface of the PCB, and the hook members pass through the engaging holes, the distal ends of the hook members resist against the bottom surface of the PCB.

19 Claims, 4 Drawing Sheets

REMOVEABLE SHIELD-CAN AND PRINTED CIRCUIT BOARD ASSEMBLY USING SAME

BACKGROUND

1. Technical Field

The present disclosure relates to shield-cans and printed circuit board (PCB) assemblies using the shield cans.

2. Description of Related Art

Electronic components in electronic devices, such as capacitors, can be protected by shield cans from external/internal electromagnetic interferences (EMI). A typical shield-can is fixed to and cannot be easily detached from a circuit board. However, to replace or repair the electronic components inside the shield can, the shield-can must be detached from the circuit board to expose the electronic components, which may easily result in damage to either or both of the shield-can and circuit board.

Therefore, there is room for improvement within the art.

BRIEF DESCRIPTION OF THE DRAWINGS

Many aspects of the disclosed shield-can and PCB assembly using the same be better understood with reference to the following drawings. The components in the drawings are not necessarily drawn to scale, the emphasis instead being placed upon clearly illustrating the principles of the exemplary shield can. Moreover, in the drawings, like reference numerals designate corresponding parts throughout the several views.

DETAILED DESCRIPTION

Figure 1:
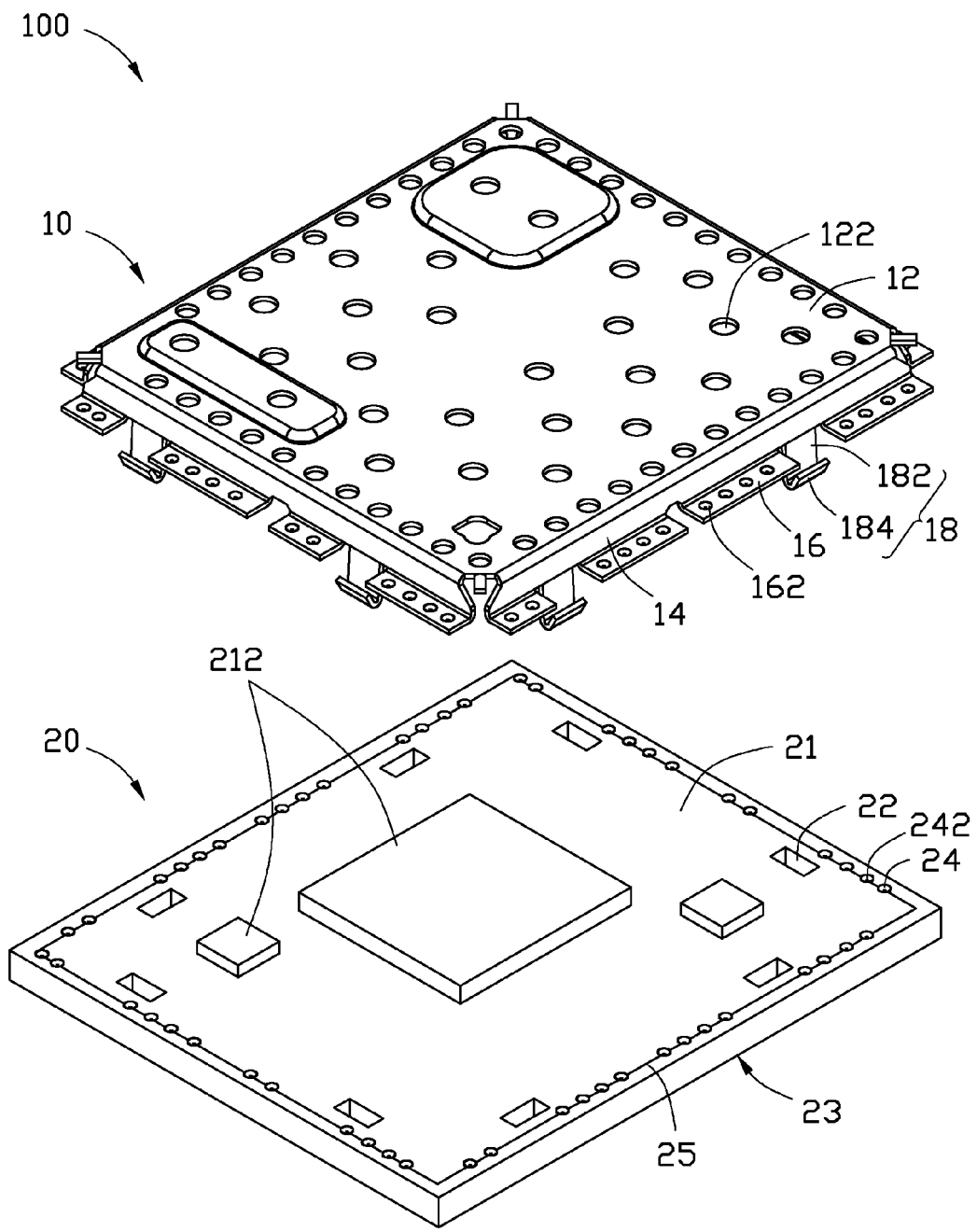
FIG. 1 is an exploded, schematic view of a PCB assembly according to an exemplary embodiment.

FIG. 1 shows a PCB assembly 100 according to an exemplary embodiment. The PCB assembly 100 includes a shield-can 10 and a PCB 20. The shield-can 10 can be detachably secured on the PCB 20 to shield electronic components connected to the PCB 20.

Figure 2:
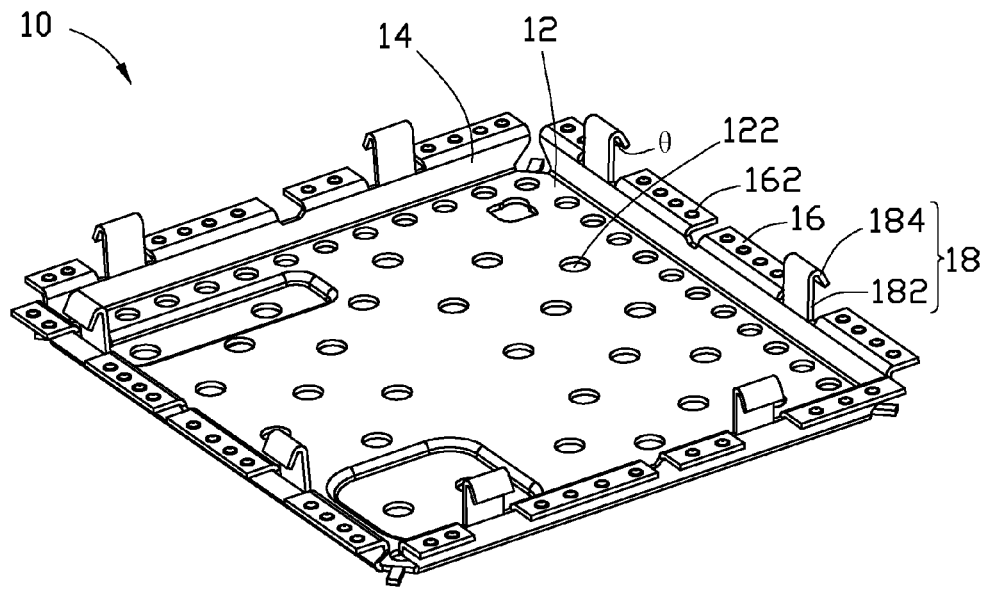
FIG. 2 is a schematic view of the shield-can shown in FIG. 1 from another view.
Figure 3:
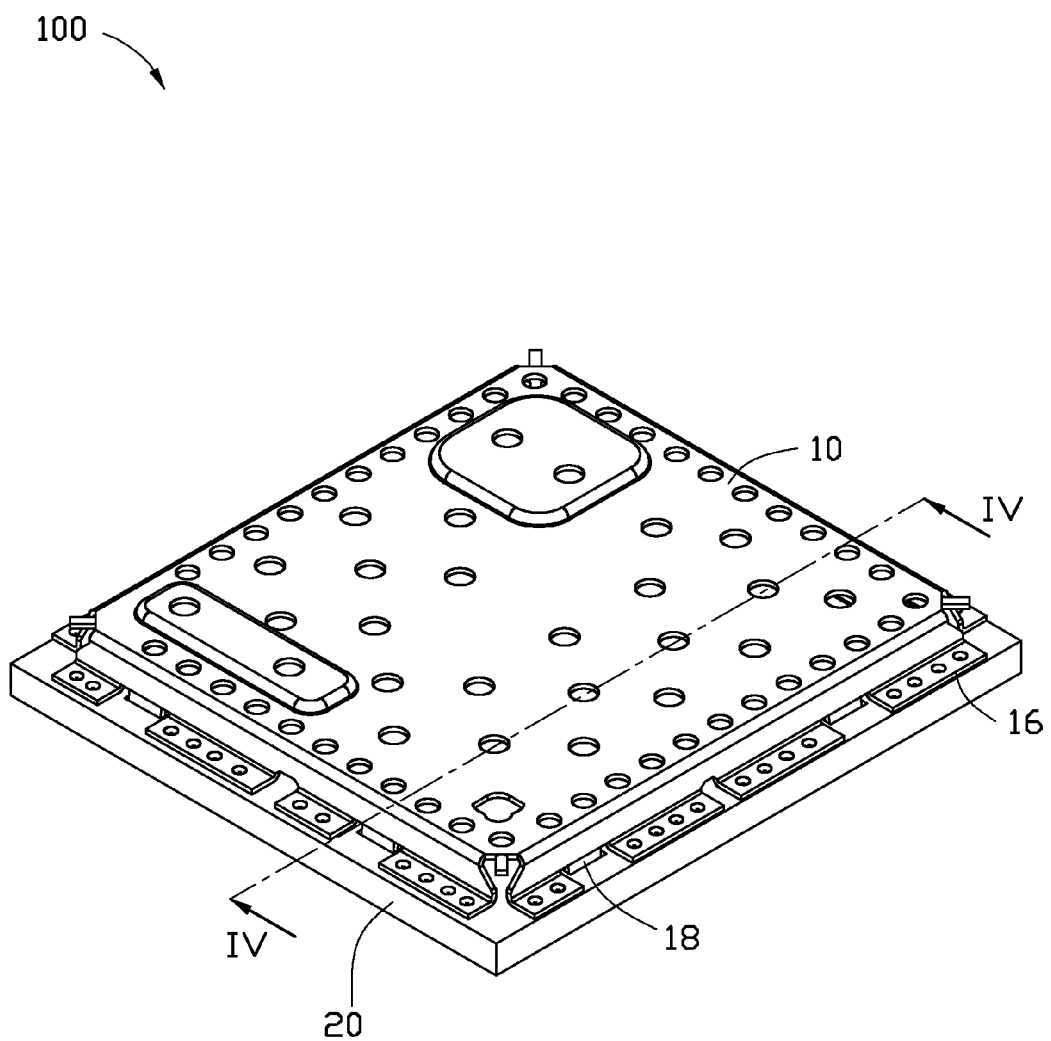
FIG. 3 is an assembled schematic view of the PCB assembly shown in FIG. 1.
Figure 4:
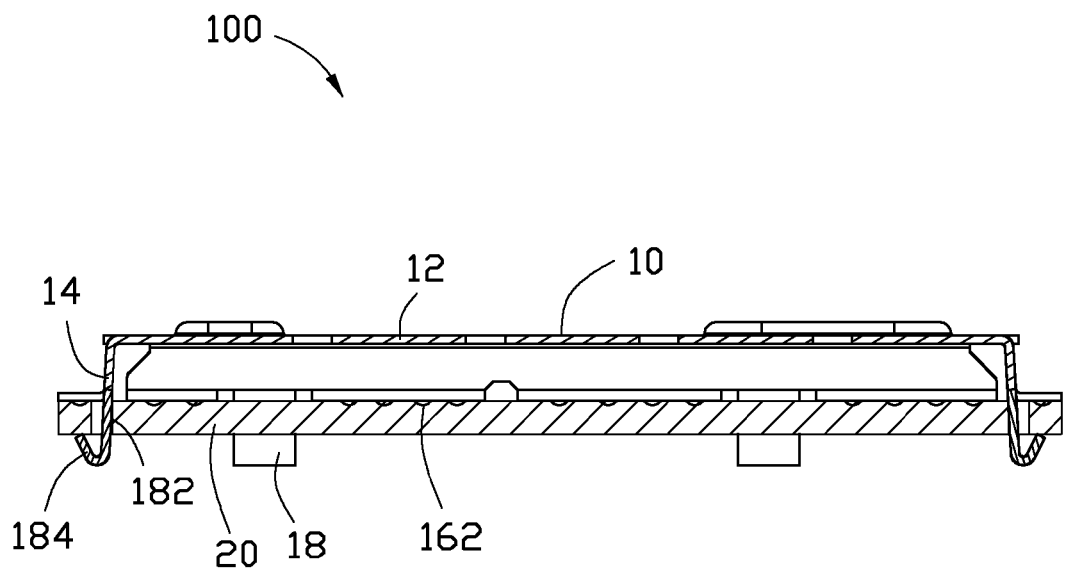
FIG. 4 is a cross-section schematic view of the assembled PCB assembly shown in FIG. 3 along the line IV-IV.

The shield-can 10 is suitable for electronic devices, such as mobile phones, personal digital assistants etc. The shield-can 100 may be made of metal materials and includes a top wall 12, sidewalls 14, resisting portions 16 and hook members 18. The sidewalls 14 substantially perpendicularly extend from the peripheral flanges of the top wall 12. The resisting portions 16 and the hook members 18 are spacedly arranged on the bottom of the sidewalls 14. In the exemplary embodiment, the top wall 12 is rectangular, and has four sidewalls 14 surrounding the top wall 12. The top wall 12 defines heat-dissipation holes 122 for heat dissipation of the electronic components enclosed inside the shield-can 10. The resisting portion 16 extends outward, perpendicularly to the sidewalls 14 and parallel with the top wall 12. The resisting portion 16 is rectangular and is used to resist against the top surface of the PCB 20. Protrusions 162 protrude downward from the bottom surface of the resisting portion 16. The protrusions 162 can be formed by punching the resisting portion 16. The hook member 18 includes a main portion 182 and a hook portion 184. The main portion 182 extends downward along the sidewall 14. The length of the main portion 182 is larger than the height of the PCB 20. The hook portion 184 extends upward from the end of the main portion 182 at an angle θ (see FIG. 2). The hook portion 184 is flexible and can be biased by external force to reduce the angle θ. The hook portion 184 can return to the original state when the external force is released.

The PCB 20 has a top surface 21 and an opposite bottom surface 23. The top surface 21 has electronic components 212 arranged thereon. The electronic components 212 need to be shielded from EMI. The PCB 20 defines engaging holes 22 through the top surface 21 and the bottom surface 23. The engaging holes 22 correspond to the hook members 18, this allows the hook members 18 to pass through the engaging holes 22. The engaging hole 22 is rectangular and the hook portion 184 is compressed and received in the engaging hole 22 when the hook members 18 passing through the engaging hole 22. The PCB 20 defines depressions 24 corresponding to receive the protrusion 162 of the shield-can 10. Each depression 24 has a connecting dot 242 therein to align and make connection with the protrusions 162. A grounded circuit 25 is formed on the top surface 21 and is electrically connected with the connecting dot 242 of each depression 24. Thus, the static electricity of the shield-can 10 can be dissipated by the grounded circuit 25.

To assemble the PCB assembly 100, the shield-can 10 is placed on the PCB 20, the hook members 18 align with the engaging holes 22. The shield-can 10 is further pushed toward the PCB 20, the hook portion 184 is compressed against the main portion 182, narrowing the angle θ, and the hook member 18 passes through the engaging hole 22. The hook portion 184 then expands relative to the main portion 182. The distal end of the hook portion 184 resists against the bottom surface 23 and the resisting portions 16 resist against the top surface 21, accordingly the PCB 20 is clamped by the hook members 18 and the resisting portions 16. At the moment, the protrusions 162 are received in the depressions 24, and each protrusion 162 electronically connects with the connecting dot 242.

The electronic components 212 are shielded in the shield-can 10. When the electronic components 212 need to be repaired, it is easier to detach the removable shield-can 10 from the PCB 20 than those that are soldered to the PCB 20. Specifically, the hook portion 184 is pressed toward the main portion 182, and the hook members 18 can be disengaged from the engaging holes 22, enabling a convenient detachment of the shield-can 20 relative to the PCB 20.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A shield can, configured for shielding components on a printed circuit board (PCB), comprising:
   a top wall;
   a plurality of sidewalls perpendicularly extending from peripheral flanges of the top wall;
   a plurality of resisting portions perpendicularly extending from bottoms of the sidewalls, each of the resisting portions being a substantially planar sheet positioned parallel with the top wall, and including a plurality of protrusions protruding from a bottom surface of the resisting portion;

a plurality of hook members extending downwardly along the sidewall, each hook member having a hook portion at the distal end; wherein:

the resisting portions resist against a top surface of the PCB, with the protrusions inserted in the PCB; the hook members pass through engaging holes defined in the PCB each hook portion resists against a bottom surface of the PCB opposite to the top surface.

2. The shield-can as claimed in claim 1, wherein the hook members and the resisting portions are spacedly arranged on the bottom of the sidewalls.

3. The shield-can as claimed in claim 1, wherein each of the hook members includes a main portion, the main portion extends downwardly along the sidewalls, and the hook portion extends upward from the end of the main portion at an angle.

4. The shield-can as claimed in claim 3, wherein the hook portion is flexible and can be biased to reduce the angle.

5. A printed circuit board (PCB) assembly, comprising:
a shield-can including a top wall, a plurality of resisting portions and a plurality of hook members; each of the resisting portions being a substantially planar sheet positioned parallel with the top wall, and including a plurality of protrusions formed thereon;
a PCB having a top surface and an opposite bottom surface, and defining a plurality of engaging holes through the top surface and bottom surface; wherein:
the shield-can is detachably assembled on the PCB, the resisting portions resist against the top surface of the PCB, with the protrusions inserted in the PCB; and the hook members pass through the engaging holes, and the distal ends of the hook members resist against the bottom surface of the PCB.

6. The PCB assembly as claimed in claim 5, wherein the shield-can further includes a plurality of sidewalls perpendicularly extending at the edge of the top wall.

7. The PCB assembly as claimed in claim 6, wherein the resisting portions perpendicularly extend at the bottom of the sidewalls, and are positioned parallel with the top wall.

8. The PCB assembly as claimed in claim 6, wherein the hook members extend downwardly along the sidewall, each hook member is hook-shaped and arranged spacedly with the resisting portions.

9. The PCB assembly as claimed in claim 6, wherein the hook member includes a main portion, the main portion extends downwardly along the sidewall, the hook portion extends upward from the end of the main portion at an angle.

10. The PCB assembly as claimed in claim 9, wherein the hook portion is flexible and can be compressed to reduce the angle.

11. The PCB assembly as claimed in claim 9, wherein the PCB defines depressions on the top surface to receive the protrusions.

12. The PCB assembly as claimed in claim 11, wherein the depression has a connecting dot therein, the connecting dot electrically connect to the protrusion.

13. The PCB assembly as claimed in claim 12, wherein the top surface of the PCB has a grounded circuit formed thereon, the grounded circuit electronically conducts with the connecting dot of each depression.

14. The shield-can as claimed in claim 1, wherein the protrusions are electrically connected to the PCB.

15. The shield-can as claimed in claim 1, wherein the top wall defines a plurality of heat-dissipation holes therein.

16. The PCB assembly as claimed in claim 5, wherein the PCB defines a plurality of depressions corresponding to the protrusions, and each of the protrusion is received in a corresponding one of the depressions.

17. The PCB assembly as claimed in claim 16, wherein the PCB further includes a plurality of connecting dots corresponding to the depressions, and each of the connecting dots is formed in a corresponding one of the depressions and electrically connected to the protrusion received in the depression.

18. The PCB assembly as claimed in claim 17, wherein the PCB further includes a grounded circuit, and the grounded circuit is electronically connected to each of the connecting dots.

19. The PCB assembly as claimed in claim 5, wherein the top wall defines a plurality of heat-dissipation holes therein.

* * * * *